US011819950B2

(12) United States Patent
Komatsu

(10) Patent No.: US 11,819,950 B2
(45) Date of Patent: Nov. 21, 2023

(54) EDGE POSITION DETECTING APPARATUS

(71) Applicant: DISCO CORPORATION, Tokyo (JP)

(72) Inventor: Atsushi Komatsu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 181 days.

(21) Appl. No.: 17/323,282

(22) Filed: May 18, 2021

(65) Prior Publication Data

US 2021/0379703 A1    Dec. 9, 2021

(30) Foreign Application Priority Data

Jun. 5, 2020   (JP) ................................ 2020-098382

(51) Int. Cl.
| | | |
|---|---|---|
| *B23K 26/70* | (2014.01) | |
| *B23K 26/08* | (2014.01) | |
| *B23K 26/073* | (2006.01) | |
| *G01N 21/95* | (2006.01) | |

(Continued)

(52) U.S. Cl.
CPC ........ *B23K 26/705* (2015.10); *B23K 26/0738* (2013.01); *B23K 26/0823* (2013.01); *B23K 26/0869* (2013.01); *G01B 11/028* (2013.01); *G01N 21/9503* (2013.01); *B23K 2101/40* (2018.08)

(58) Field of Classification Search
CPC H01L 21/681; G01B 11/028; G01N 21/9503; B23K 26/705; B23K 26/0823; B23K 26/0869
See application file for complete search history.

(56) References Cited

U.S. PATENT DOCUMENTS

| | | | | |
|---|---|---|---|---|
| 6,323,954 B1 * | 11/2001 | Halter | ...................... | B65H 7/08 356/624 |
| 6,845,174 B2 * | 1/2005 | Grau | ...................... | G06V 10/10 382/149 |

(Continued)

FOREIGN PATENT DOCUMENTS

| | | | |
|---|---|---|---|
| JP | 2000173961 A | | 6/2000 |
| JP | 2003197570 A | * | 7/2003 |

(Continued)

*Primary Examiner* — John J Norton
*Assistant Examiner* — Franklin Jefferson Wang
(74) *Attorney, Agent, or Firm* — Greer, Burns & Crain, Ltd.

(57) ABSTRACT

An edge position detecting apparatus for detecting a position of an edge of a disk-shaped workpiece includes a chuck table having a holding surface for holding the workpiece thereon, a laser displacement gage having a laser applying unit including a light source, for applying a linear laser beam shaped into a linear shape perpendicular to a direction of travel from the light source toward the holding surface, across the edge of the workpiece, and a beam detecting unit including a plurality of photoelectric transducers arrayed at predetermined spaced intervals along a direction for detecting a reflection of the linear laser beam, a moving mechanism for moving the laser displacement gage and the chuck table relatively to each other along the longitudinal direction, and a calculating unit for calculating the position of the edge on the basis of information of a change in an amount of the detected reflection.

14 Claims, 10 Drawing Sheets

(51) Int. Cl.
  *G01B 11/02*  (2006.01)
  *B23K 101/40*  (2006.01)

(56) References Cited

U.S. PATENT DOCUMENTS

| | | | | |
|---|---|---|---|---|
| 2004/0149940 A1* | 8/2004 | Buisker | .............. | B65H 23/0216 |
| | | | | 250/559.36 |
| 2008/0319559 A1* | 12/2008 | De Ridder | ........ | H01L 21/67265 |
| | | | | 250/208.3 |
| 2009/0153868 A1* | 6/2009 | Sawabe | .............. | B23K 26/0665 |
| | | | | 356/445 |
| 2014/0240719 A1* | 8/2014 | Koeppe | .................. | G01B 11/14 |
| | | | | 356/625 |

FOREIGN PATENT DOCUMENTS

| | | | | | |
|---|---|---|---|---|---|
| JP | 2010016069 A | * | 1/2010 | | |
| JP | 2013016747 A | * | 1/2013 | | |
| JP | 2013258423 A | * | 12/2013 | ....... | H01L 21/67265 |

* cited by examiner

EDGE POSITION DETECTING APPARATUS

BACKGROUND OF THE INVENTION

Field of the Invention

The present invention relates to an edge position detecting apparatus and an edge position detecting method for detecting a position of an edge of an outer circumferential portion of a disk-shaped workpiece.

Description of the Related Art

Some plate-shaped workpieces such as semiconductor wafers have outer circumferential edges beveled off on their face and reverse sides. When the reverse side of a plate-shaped workpiece with its outer circumferential edge beveled off is ground to thin the workpiece to a thickness approximately one-half of the original thickness, for example, what is generally called a knife edge, also called a sharp edge, is formed on the outer circumferential portion of the workpiece. The knife edge formed on the outer circumferential portion of the workpiece tends to cause the workpiece to crack, chip, break, or otherwise be damaged. According to a known technology for preventing a plate-shaped workpiece from cracking and so on, the outer circumferential portion of the workpiece is removed by cutting or the like, i.e., trimmed, on its face side, and then the reverse side of the workpiece is ground to thin the workpiece (see, for example, JP 2000-173961A).

For trimming the outer circumferential portion of the workpiece on its face side, the reverse side of the workpiece is held on a chuck table and then the position of an edge of the outer circumferential portion of the workpiece on its face side is detected. Thereafter, the range of the face side of the workpiece that is to be cut is determined using the detected position of the edge as a reference. A laser displacement gage, for example, is used to detect the position of the edge. The laser displacement gage includes a laser applying unit for applying a linear laser beam to the face side of the workpiece and a beam detecting unit for detecting a reflection of the linear laser beam from the face side of the workpiece.

The beam detecting unit has a line sensor made up of a plurality of photoelectric transducers arrayed at predetermined spaced intervals along a longitudinal direction of the linear laser beam. The beam detecting unit detects the reflection of the linear laser beam that has been applied to the workpiece across the edge. The accuracy with which the position of the edge is detected depends on the intervals between the photoelectric transducers because the beam detecting unit detects no reflection at a position between adjacent two of the photoelectric transducers.

SUMMARY OF THE INVENTION

The present invention has been made in view of the problems of the related art, and it is an object of the present invention to provide an edge position detecting apparatus and an edge position detecting method that will detect the position of an edge of a workpiece with increased accuracy in the case where a beam detecting unit used in the edge position detecting apparatus and the edge position detecting method has a plurality of photoelectric transducers arrayed at predetermined spaced intervals.

In accordance with an aspect of the present invention, there is provided an edge position detecting apparatus for detecting a position of an edge of a disk-shaped workpiece, including a chuck table having a holding surface for holding the workpiece thereon, a laser displacement gage having a laser applying unit including a light source disposed above the chuck table, for applying a linear laser beam shaped into a linear shape perpendicular to a direction of travel from the light source toward the holding surface, across the edge of the workpiece, and a beam detecting unit including a plurality of photoelectric transducers arrayed at predetermined spaced intervals along a longitudinal direction of an irradiated area that is irradiated by the linear laser beam, for detecting a reflection of the linear laser beam, a moving mechanism for moving the laser displacement gage and the chuck table relatively to each other along the longitudinal direction of the irradiated area, and a calculating unit having a processor, for calculating the position of the edge of the workpiece on the basis of information of a change in an amount of the reflection detected by the beam detecting unit.

Preferably, the chuck table is rotatable about a predetermined rotational axis, and the longitudinal direction of the irradiated area is disposed along a predetermined direction perpendicular to the predetermined rotational axis, and while the linear laser beam is being applied to the workpiece held on the holding surface, the moving mechanism moves the laser displacement gage and the chuck table relatively to each other at a relative movement speed V along the longitudinal direction, the photoelectric transducers include a first photoelectric transducer and a second photoelectric transducer that are disposed adjacent to each other, and in a case where an amount of the reflection detected by the first photoelectric transducer remains unchanged but an amount of the reflection detected by the second photoelectric transducer changes in a period T of time during which the laser displacement gage is moved at the relative movement speed V, the calculating unit calculates a position that is spaced V·T from an original position of the second photoelectric transducer prior to the period T of time during which the laser displacement gage is moved toward a position of the first photoelectric transducer adjacent to the second photoelectric transducer, thereby calculating the position of the edge of the workpiece.

In accordance with another aspect of the present invention, there is provided an edge position detecting method for detecting a position of an edge of a disk-shaped workpiece, including a holding step of holding a surface of the workpiece on a holding surface of a chuck table, a first detecting step of applying a linear laser beam shaped into a linear shape perpendicular to a direction of travel to another surface of the workpiece that is positioned opposite the surface thereof, across the edge of the workpiece, and detecting a reflection of the linear laser beam with a first photoelectric transducer and a second photoelectric transducer adjacent thereto among a plurality of photoelectric transducers arrayed at predetermined spaced intervals along a longitudinal direction of an irradiated area that is irradiated by the linear laser beam, a second detecting step of moving the linear laser beam and the chuck table relatively to each other along the longitudinal direction of the irradiated area while the linear laser beam is being applied to the other surface of the workpiece across the edge of the workpiece, to thereby detect a change in an amount of a reflection of the linear laser beam detected by the second photoelectric transducer, and an edge position calculating step of calculating the position of the edge of the workpiece by calculating a position that is spaced a distance V·T$_1$ from a position of the second photoelectric transducer toward a position of the first photoelectric transducer in the first detecting step, on the basis of the distance $V \cdot T_1$ calculated as a product of first period $T_1$ of time from a detection timing in the first detecting step to a detection timing in the second detecting step and a relative movement speed V at which the linear laser beam and the chuck table are moved relatively to each other along the longitudinal direction of the irradiated area.

Preferably, the chuck table is rotatable about a predetermined rotational axis, the longitudinal direction of the irradiated area is disposed along a predetermined direction perpendicular to the predetermined rotational axis, the edge position calculating step includes, after the holding step, a rotation starting step of starting to rotate the chuck table at a predetermined rotational speed $V_R$ (degrees/second) about the predetermined rotational axis, a third detecting step of detecting a change in an amount of the reflection detected by a third photoelectric transducer among the first photoelectric transducer, the second photoelectric transducer, the third photoelectric transducer, and a fourth photoelectric transducer that are disposed on a straight line at the predetermined spaced intervals, and a fourth detecting step of detecting a change in an amount of the reflection detected by the fourth photoelectric transducer, and the edge position calculating step further includes a first calculating step of calculating a position that is spaced $V \cdot T_1$ from the position of the second photoelectric transducer toward the position of the first photoelectric transducer in the first detecting step, to thereby detect a first position of the edge of the workpiece when the chuck table has rotated $V_R \cdot T_1$, a second calculating step of calculating a position that is spaced $V \cdot T_2$ from a position of the third photoelectric transducer toward the position of the second photoelectric transducer in the second detecting step, on the basis of second period $T_2$ of time from the detection timing in the second detecting step to a detection timing in the third detecting step, to thereby detect a second position of the edge of the workpiece when the chuck table has rotated $V_R \cdot (T_1+T_2)$, and a third calculating step of calculating a position that is spaced $V \cdot T_3$ from a position of the fourth photoelectric transducer toward the position of the third photoelectric transducer in the third detecting step, on the basis of third period $T_3$ of time from the detection timing in the third detecting step to a detection timing in the fourth detecting step, to thereby detect a third position of the edge of the workpiece when the chuck table has rotated $V_R \cdot (T_1+T_2+T_3)$.

The edge position detecting apparatus according to the aspect of the present invention includes the chuck table and the laser displacement gage. The laser displacement gage has the laser applying unit that applies the linear laser beam shaped into the linear shape perpendicular to the direction of travel across the edge of the workpiece, and the beam detecting unit including the photoelectric transducers arrayed at the predetermined spaced intervals along the longitudinal direction of the irradiated area that is irradiated by the linear laser beam, for detecting the reflection of the linear laser beam. The edge position detecting apparatus further includes the moving mechanism for moving the laser displacement gage and the chuck table relatively to each other along the longitudinal direction of the irradiated area, and the calculating unit for calculating the position of the edge of the workpiece on the basis of information of a change in the amount of the reflection detected by the beam detecting unit. By identifying the position of the edge with use of the beam detecting unit while moving the linear laser beam with the moving mechanism, the edge position detecting apparatus can detect the position of the edge of the workpiece even at positions between adjacent two of the photoelectric transducers. The edge position detecting apparatus is able to detect the position of the edge of the workpiece with higher accuracy than if the position of the edge is detected using a line sensor that remains still.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
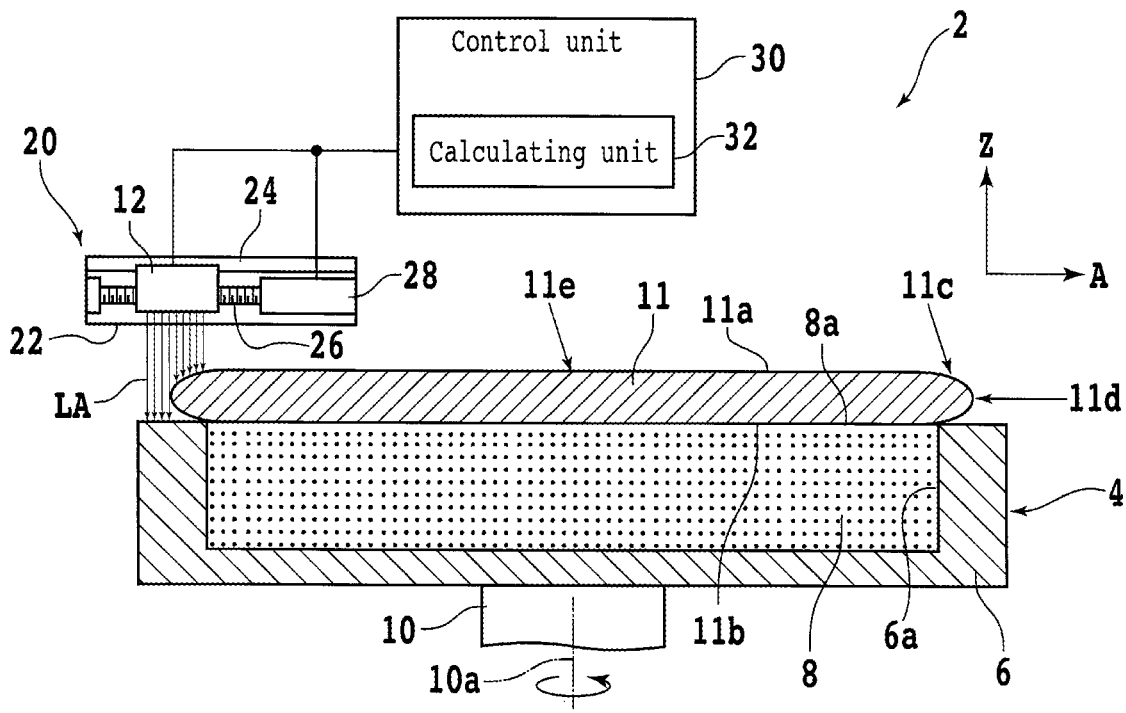
FIG. 1A is a side elevational view, partly in cross section, of an edge position detecting apparatus according to the present invention.
Figure 1B:
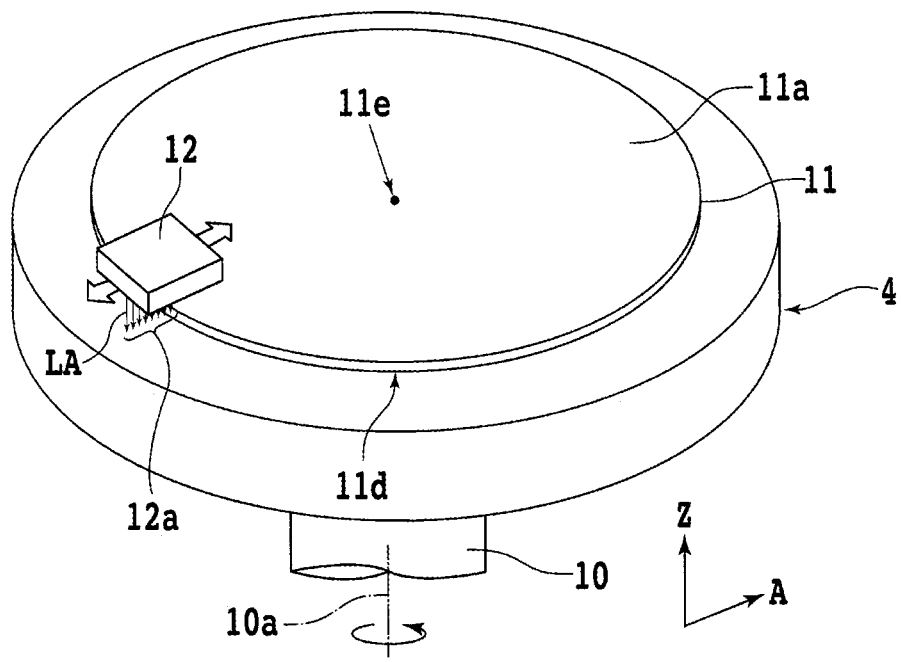
FIG. 1B is a perspective view of the edge position detecting apparatus.

Preferred embodiments of the present invention will hereinafter be described with reference to the accompanying drawings. FIG. 1A illustrates, in side elevation, partly in cross section, an edge position detecting apparatus 2 according to an embodiment of the present invention, and FIG. 1B illustrates in perspective the edge position detecting apparatus 2. In FIG. 1A, some components of the edge position detecting apparatus 2 are illustrated in block form. In FIG. 1B, some components of the edge position detecting apparatus 2 are omitted from illustration. First, a workpiece 11 as an object to be detected will be described below.

The workpiece 11 includes a disk-shaped wafer made of a semiconductor material such as silicon. However, the workpiece 11 is not limited to any particular materials, structures, sizes, etc. The workpiece 11 has a grid of projected dicing lines, not illustrated, established on a face side, i.e., other surface, 11a thereof, and devices, not illustrated, such as integrated circuits (ICs), formed in respective areas demarcated by the projected dicing lines. The workpiece 11 includes a reverse side, i.e., one surface, 11b positioned opposite the face side 11a. The face side 11a and the reverse side 11b have respective outer circumferential portions beveled off, providing respective bevels. The workpiece 11 also has an outer circumferential portion 11c positioned intermediate between the face side 11a and the reverse side 11b and including an edge 11d that defines a diameter of the workpiece 11.

The edge 11d is of a circular shape as viewed in plan. In FIGS. 1A and 1B, the circular shape has a center 11e illustrated on the face side 11a. The reverse side 11b of the workpiece 11 is held on a disk-shaped chuck table 4. The chuck table 4 has a disk-shaped frame 6 made of metal. The frame 6 has a disk-shaped recess 6a defined in an upper portion thereof. The recess 6a is open upwardly and has a bottom surface defined by a bottom portion of the frame 6 with a suction channel, not illustrated, defined therein. The suction channel has an end exposed at the bottom surface of the recess 6a and another end connected to a suction source, not illustrated, such as an ejector.

A disk-shaped porous plate 8 having substantially flat upper and lower surfaces that are axially spaced from each other is fixedly disposed in the recess 6a. When the suction source is actuated, it produces a negative pressure that acts through the suction channel and the porous plate 8 on the upper surface of the porous plate 8. The upper surface of the porous plate 8 and the upper surface of an outer circumferential portion of the frame 6 that is positioned around the porous plate 8 jointly function as a holding surface 8a for holding the workpiece 11 under suction thereon. The bottom portion of the frame 6, i.e., the chuck table 4, is coupled to an upper end of an output shaft 10 of a rotary actuator, not illustrated, such as an electric motor. The output shaft 10 of the rotary actuator is coupled to a central portion of the bottom portion of the frame 6. When the rotary actuator is energized to rotate the output shaft 10 about its central axis, the chuck table 4 is rotated about a rotational axis, i.e., a predetermined rotational axis, 10a extending generally parallel to a Z-axis direction, i.e., a vertical direction or a heightwise direction, of the edge position detecting apparatus 2.

Figure 2A:
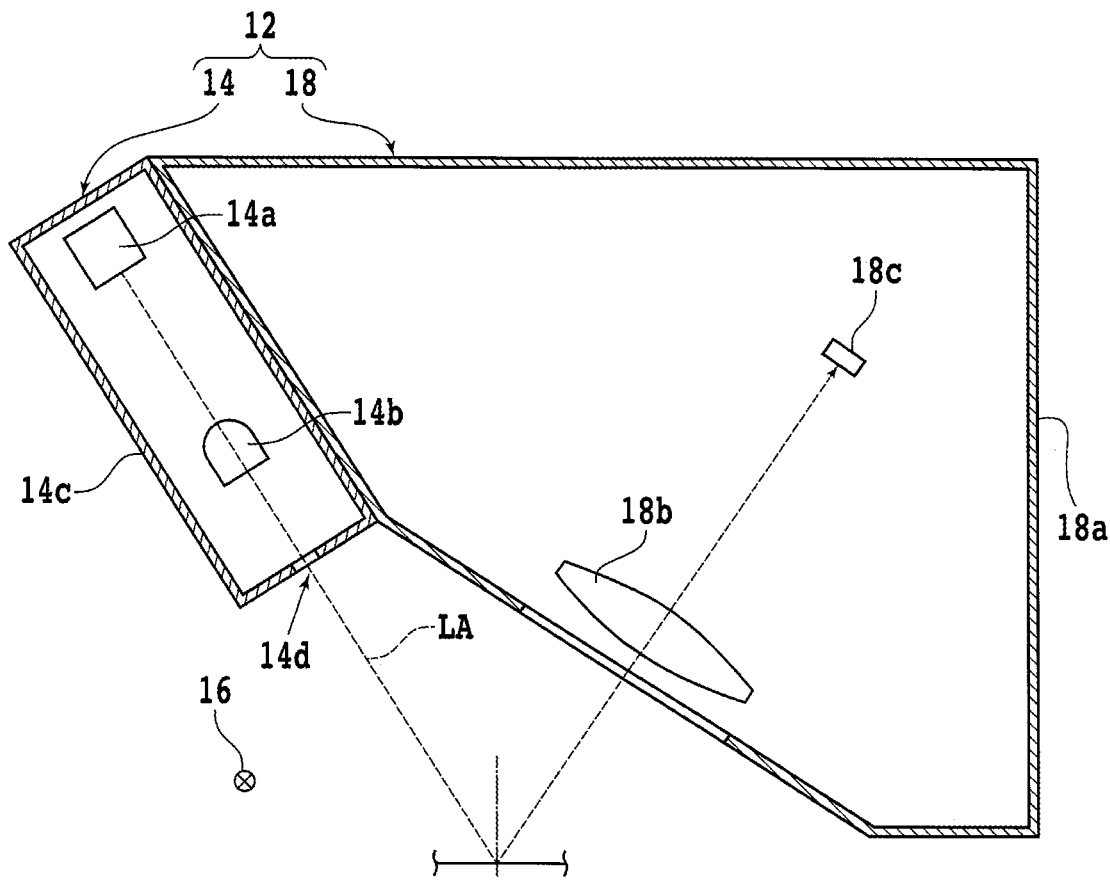
FIG. 2A is an enlarged vertical cross-sectional view illustrative of a general structural make-up of a laser displacement gage.
Figure 2B:
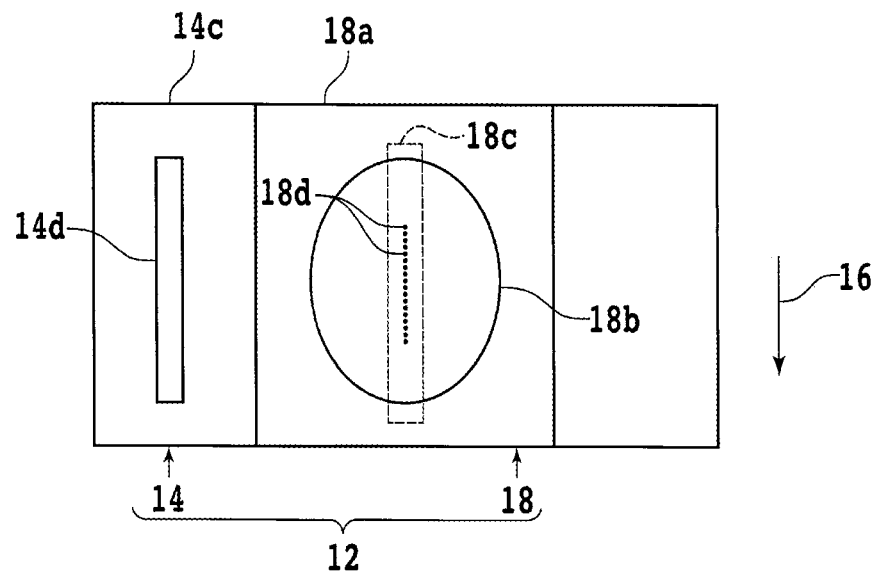
FIG. 2B is a bottom view of the laser displacement gage.

A laser displacement gage 12 is disposed above the chuck table 4. The laser displacement gage 12 is capable of applying a linear laser beam LA to an irradiated area 12a (see FIG. 1B) of the holding surface 8a, the irradiated area 12a extending linearly in a longitudinal direction along a predetermined direction A (see FIG. 1A) perpendicular to the rotational axis 10a. FIG. 2A is illustrative of a general structural make-up of the laser displacement gage 12 in enlarged vertical cross-section. FIG. 2B illustrates the laser displacement gage 12 in bottom view. The laser displacement gage 12 has a light source 14a including a semiconductor laser, i.e., a laser diode.

A laser beam emitted from the light source 14a falls on a laser line generator, hereinafter simply referred to as a "lens 14b," such as a Powell lens, a Lineman lens, or a cylindrical lens. The lens 14b shapes the applied laser beam into the linear laser beam LA that has a predetermined length along a first direction 16 perpendicular to the direction of travel of the laser beam, i.e., the direction from the light source 14a toward the holding surface 8a, and that has a substantially uniform output power level along the first direction 16. The first direction 16 extends parallel to the longitudinal direction of the irradiated area 12a of the holding surface 8a to which the linear laser beam LA is applied. The light source 14a and the lens 14b are housed in a casing 14c. The light source 14a, the lens 14b, and the casing 14c jointly make up a laser applying unit 14.

The casing 14c has a rectangular opening 14d defined in a bottom wall thereof and extending longitudinally along the first direction 16. The linear laser beam LA shaped by the lens 14b leaves the laser applying unit 14 through the opening 14d and is reflected by way of specular reflection from a target for measurement and applied to a beam detecting unit 18 that is disposed adjacent to the laser applying unit 14. The beam detecting unit 18 has a casing 18a disposed adjacent to and fixed to the casing 14c. A condensing lens 18b is fixedly disposed in the casing 18a. The condensing lens 18b may be a single lens or may be made up of a plurality of lenses like a lens known as Ernostar. The reflected linear laser bean LA that has entered the beam detecting unit 18 is converged by the condensing lens 18b and applied to a line sensor 18c.

The line sensor 18c has a plurality of photoelectric transducers 18d arrayed at predetermined spaced intervals 18e (see FIG. 3B, etc.) along a longitudinal direction of the irradiated area 12a that is irradiated by the laser beam LA. According to the present embodiment, each of the predetermined spaced intervals 18e is 10 μm. Each of the photoelectric transducers 18d includes a photosensor such as a phototransistor. Each of the photoelectric transducers 18d detects and photoelectrically converts a reflection, i.e., a laser beam, reflected from a target for measurement, into a voltage signal depending on the amount of the reflection or the detected laser beam at each of predetermined sampling periods of 0.1 second, for example, and outputs the voltage signal. The unit "second" is abbreviated as "s" in the present description. The voltage signal, which is an analog signal, is converted into a digital signal by a processing circuit, not illustrated, including an analog-to-digital converter (ADC), and the digital signal is processed by a control unit 30 (see FIG. 1A) to be described later.

The orientation and operation of the laser displacement gage 12 of the edge position detecting apparatus 2 will be described below with reference to FIGS. 1A and 1B. The laser displacement gage 12 is oriented such that the longitudinal direction of the irradiated area 12a that is irradiated by the linear laser beam LA applied to the face side 11a of the workpiece 11 and extends parallel to the predetermined direction A. The laser displacement gage 12 is coupled to a moving mechanism 20 for moving the laser displacement gage 12 relatively to the chuck table 4 along the predetermined direction A. The moving mechanism 20 has a plate-shaped base 22 fixed to a foundation, not illustrated, of the edge position detecting apparatus 2.

The moving mechanism 20 includes a pair of guide rails 24 extending parallel to the predetermined direction A and fixed to a surface of the base 22. In FIG. 1A, one of the guide rails 24 is illustrated. The casing 14c or 18a of the laser displacement gage 12 has an upper portion slidably mounted on the guide rails 24. A nut, not illustrated, is attached to a side surface of the casing 14c or 18a. The moving mechanism 20 also includes a ball screw 26 extending substantially parallel to the guide rails 24 and rotatably threaded through the nut. The ball screw 26 has an end coupled to a bearing mounted on the base 22 and another end coupled to a stepping motor 28 mounted on the base 22.

When the stepping motor 28 is energized to rotate the ball screw 26, the laser displacement gage 12 is moved along the guide rails 24. For example, the laser displacement gage 12 is moved along the guide rails 24 at a speed of 10 μm/s relative to the chuck table 4, for example. The laser displacement gage 12 and the stepping motor 28 are electrically connected to the control unit 30. The control unit 30 controls operation of the suction source and the rotary actuator that are associated with the chuck table 4, the laser displacement gage 12, the stepping motor 28, etc.

The control unit 30 is implemented by a computer, for example, including a processor such as a central processing unit (CPU), a main storage unit such as a dynamic random access memory (DRAM), a static random access memory (SRAM), or a read only memory (ROM), and an auxiliary storage unit such as a flash memory, a hard disk drive, or a solid-state drive. The processor, etc., is operated according to software including predetermined programs stored in the auxiliary storage unit to realize functions of the control unit 30. The auxiliary storage unit also stores the predetermined programs.

Part of the control unit 30 functions as a calculating unit 32 when the programs are executed by the processor. The calculating unit 32 calculates the position, i.e., X and Y coordinates, of the edge 11d of the workpiece 11, using the initial positions of the respective photoelectric transducers 18d, the speed at which and the period of time during which the laser displacement gage 12 is moved, the digital signal referred to above, etc. The initial positions of the respective photoelectric transducers 18d are recognized in advance by the calculating unit 32 with respect to the rotational axis 10a regarded as an origin ($X_0$, $Y_0$), for example. According to the present embodiment, the direction in which the laser displacement gage 12 is moved coincides with the predetermined direction A.

Figure 3A:
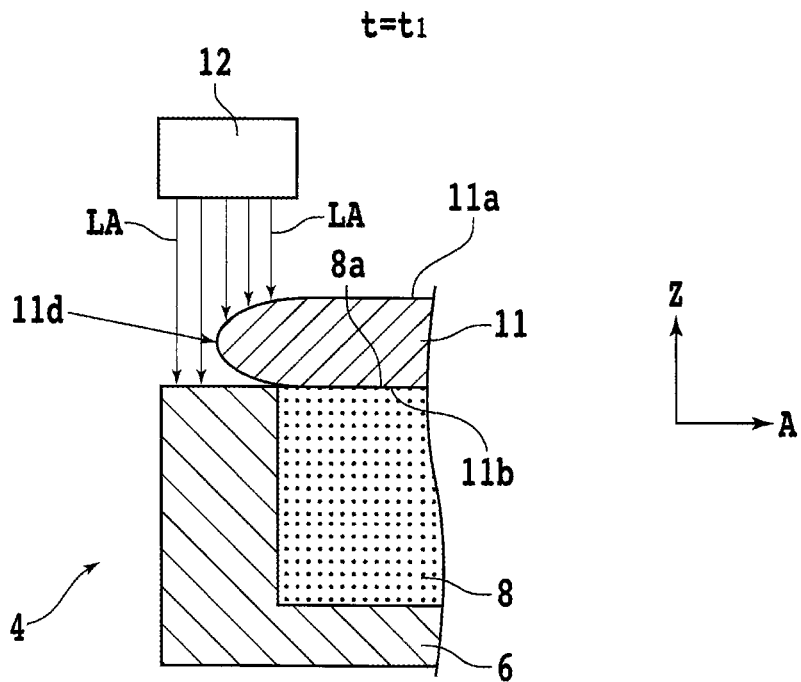
FIG. 3A is a view illustrating a laser beam at time $t_1$.

An outline of a step of calculating the position of the edge 11d by using the edge position detecting apparatus 2 is described here. FIG. 3A illustrates the linear laser beam LA at time $t_1$. The linear laser beam LA is applied to the outer circumferential portion 11c of the workpiece 11 held on the holding surface 8a across the edge 11d along the predetermined direction A. The amount of the reflected laser beam from the face side 11a of the workpiece 11 is larger than the amount of the reflected laser beam from the holding surface 8a. Therefore, as illustrated in FIG. 3B, respective output voltages from those photoelectric transducers 18d which have detected the reflected laser beam from the face side 11a are of a high level (H), and respective output voltages from those photoelectric transducers 18d which have detected the reflected laser beam from the holding surface 8a are of a low level (L).

Figure 3B:
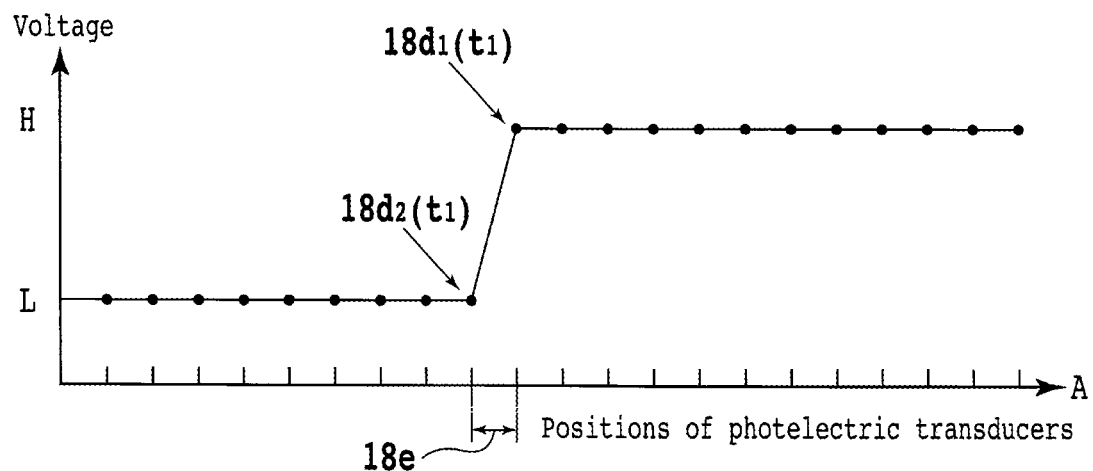
FIG. 3B is a diagram illustrating output voltages from photoelectric transducers at time $t_1$.

FIG. 3B illustrates respective output voltages from the photoelectric transducers 18d at time $t_1$. In FIG. 3B, the photoelectric transducers 18d include a first photoelectric transducer $18d_1$ positioned above the face side 11a and a second photoelectric transducer $18d_2$ positioned adjacent to the first photoelectric transducer $18d_1$ and above the upper surface of the outer circumferential portion of the frame 6. Though it can be said in FIG. 3B that the edge 11d of the workpiece 11 is positioned between these two photoelectric transducers 18d, i.e., the first photoelectric transducer $18d_1$ and the second photoelectric transducer $18d_2$, the position of the edge 11d cannot be identified with higher accuracy than the predetermined intervals 18e. In other words, it is not possible to identify where the edge 11d is located in the corresponding interval 18e according to the output voltages illustrated in FIG. 3B. According to the present embodiment, while the linear laser beam LA is being applied to the workpiece 11 and the frame 6, the moving mechanism 20 moves the laser displacement gage 12 along the longitudinal direction of the linear laser beam LA, i.e., the predetermined direction A, relatively to the chuck table 4 at a relative movement speed V.

Figure 4A:
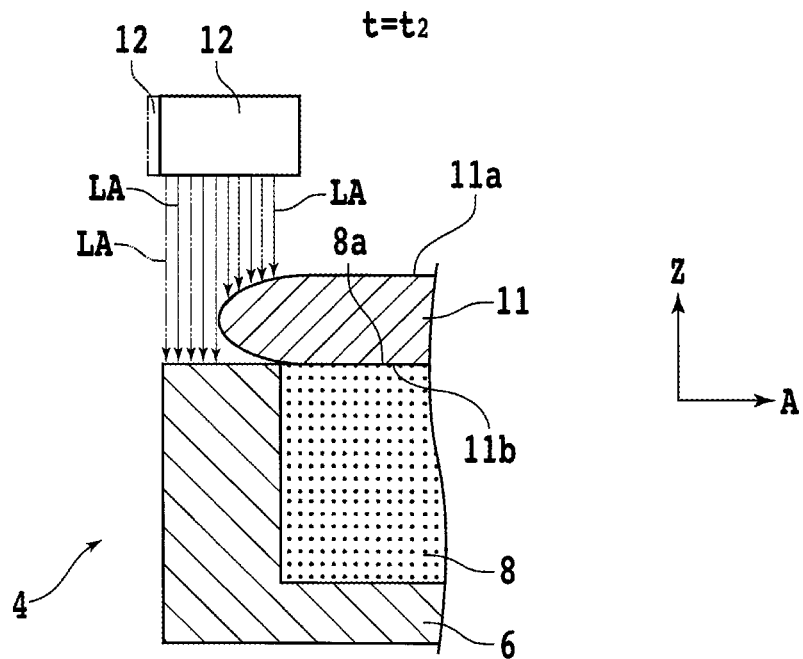
FIG. 4A is a view illustrating a laser beam at time $t_2$.

FIG. 4A illustrates the linear laser beam LA at time $t_2$ after elapse of a certain period of time from time $t_1$, i.e., after the laser displacement gage 12 has been moved for a period T of time. In FIG. 4A, the linear laser beam LA and the laser displacement gage 12 at time $t_2$ are indicated by the solid lines, whereas the linear laser beam LA and the laser displacement gage 12 at time $t_1$ are indicated by the two-dot-and-dash lines. It is assumed that the period T of time is longer than a sampling period. As the laser displacement gage 12 is moved, the beam detecting unit 18 is also moved in the predetermined direction A. When the output voltage from first photoelectric transducer $18d_1$ remains unchanged but the output voltage from the second photoelectric transducer $18d_2$ is changed at time $t_2$, the position of the second photoelectric transducer $18d_2$ corresponds to the position of the edge 11d.

Figure 4B:
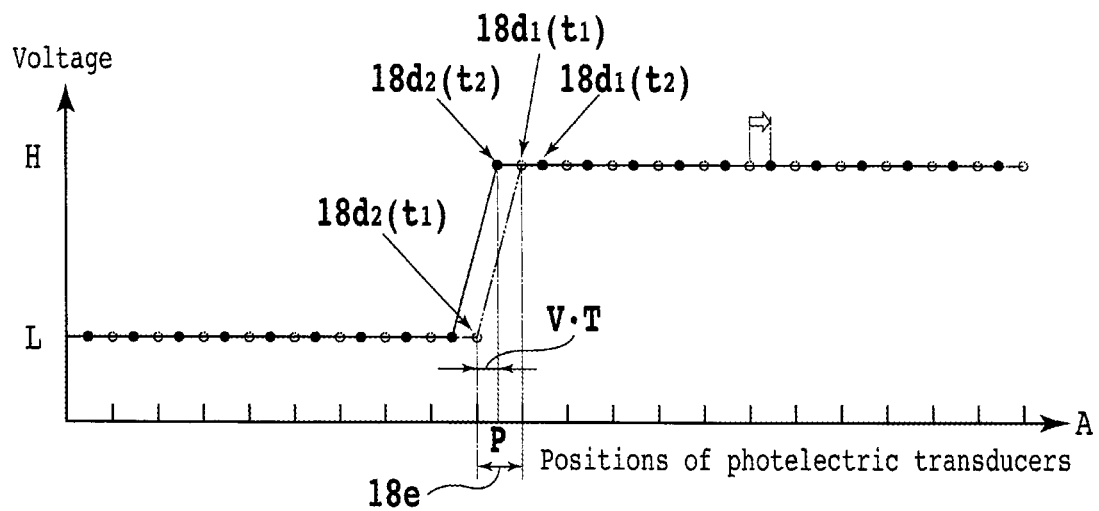
FIG. 4B is a diagram illustrating output voltages from the photoelectric transducers at time $t_2$.

FIG. 4B illustrates respective output voltages from the photoelectric transducers 18d at time $t_2$. In FIG. 4B, the photoelectric transducers 18d at time $t_2$ are indicated by the solid lines, whereas the photoelectric transducers 18d at time $t_1$ are indicated by the two-dot-and-dash lines. The calculating unit 32 calculates coordinates of a position P that is spaced V·T from the position of the second photoelectric transducer $18d_2$ at time $t_1$, i.e., its original position at a time earlier than time $t_2$ by the period T of time, toward the position of the first photoelectric transducer $18d_1$ at time $t_1$. In this manner, the coordinates, i.e., the position, of the edge 11d at time $t_2$ are calculated.

Figure 5:
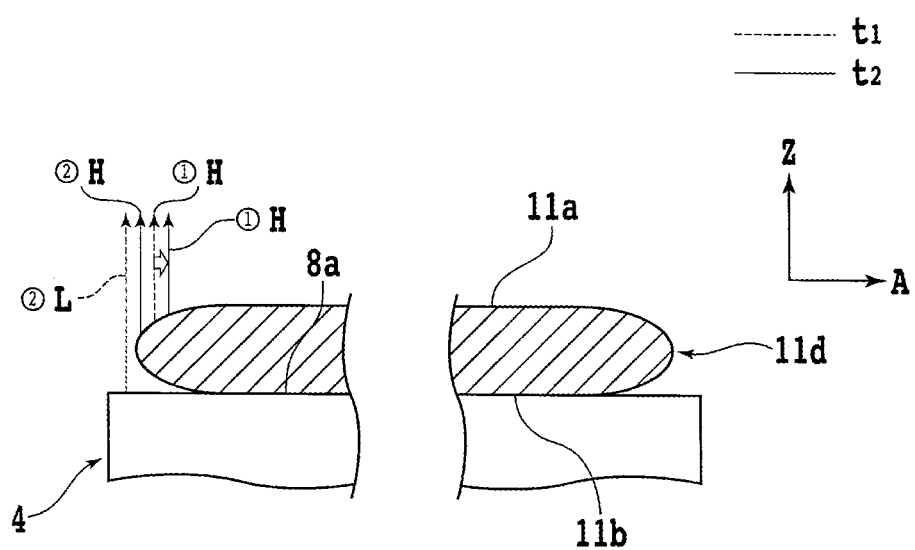
FIG. 5 is a view illustrating time-depending changes in output voltages from first and second photoelectric transducers.

FIG. 5 illustrates in a simpler fashion time-depending changes in the output voltages from the first and second photoelectric transducers $18d_1$ and $18d_2$ illustrated in FIG. 4B. In FIG. 5, encircled numerals 1 signify the first photoelectric transducer $18d_1$, whereas encircled numerals 2 signify the second photoelectric transducer $18d_2$. Further, in FIG. 5, a letter L on the right side of the encircled numerals indicates that the output voltage is of a low level, whereas a letter H on the right side of the encircled numerals indicates that the output voltage is of a high level. Broken-line arrows indicate the reflected laser beam at time $t_1$, whereas solid-line arrows indicate the reflected laser beam at time $t_2$. In addition, an outlined arrow signifies the direction in which the laser displacement gage 12 is moved. According to the present embodiment, the position of the edge 11d of the workpiece 11 can be detected even at positions between adjacent two of the photoelectric transducers 18d by moving the laser displacement gage 12. In other words, the accuracy with which to detect the edge 11d is made higher than if the position of the edge 11d is detected with the line sensor 18c remaining still.

Figure 6:
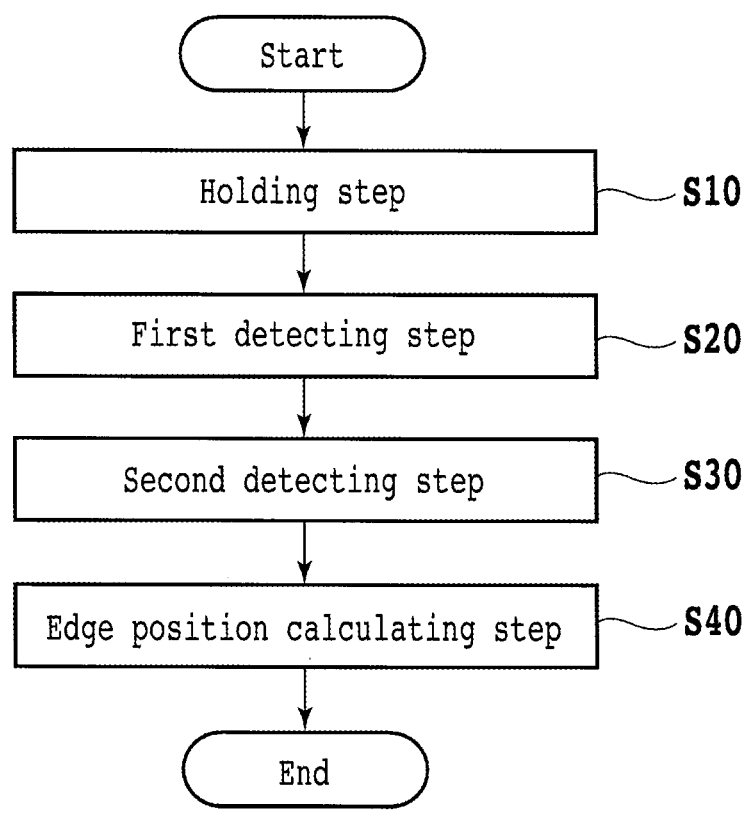
FIG. 6 is a flowchart of an edge position detecting method according to a first embodiment of the present invention.

An edge position detecting method for detecting the position of the edge 11d of the outer circumferential portion of the workpiece 11 with use of the edge position detecting apparatus 2 will be described below. FIG. 6 is a flowchart of an edge position detecting method according to a first embodiment of the present invention. First, as illustrated in FIG. 1A, the reverse side 11b of the workpiece 11 is held on the holding surface 8a such that the face side 11a of the workpiece 11 is exposed upwardly (holding step S10). At this time, the center 11e of the face side 11a is positioned on or near the rotational axis 10a.

After holding step S10, while the linear laser beam LA is being applied to the face side 11a across the edge 11d, the moving mechanism 20 moves the laser displacement gage 12 and the chuck table 4 along the predetermined direction A at the relative movement speed V. At this time, as illustrated in FIG. 5, the first photoelectric transducer $18d_1$ is positioned ahead of the second photoelectric transducer $18d_2$. At time $t_1$, i.e., at detection timing $t_1$, the first photoelectric transducer $18d_1$ is positioned above the face side 11a, and the second photoelectric transducer $18d_2$ is positioned not above the face side 11a, but outside of the edge 11d. The calculating unit 32 detects output voltages from the photoelectric transducers 18d depending on the amounts of the laser beams detected by the photoelectric transducers 18d (first detecting step S20).

After first detecting step S20, i.e., time $t_1$, the output voltage from the second photoelectric transducer $18d_2$ changes from L to H at time $t_2$, i.e., detection timing $t_2$, when the second photoelectric transducer $18d_2$ is positioned above the face side 11a for the first time. The calculating unit 32 detects the change in the output voltage from the second photoelectric transducer $18d_2$ at time $t_2$ (second detecting step S30). After second detecting step S30, i.e., time $t_2$, the calculating unit 32 calculates the position of the edge 11d on the basis of the distance V·T that a photoelectric transducer 18d has moved, i.e., the product of the period T of time (first period $T_1$) from time $t_1$ to time $t_2$ and the relative movement speed V (edge position calculating step S40).

For example, the calculating unit 32 calculates coordinates, i.e., a position, that are spaced V·T, i.e., V·$T_1$, from the position of the second photoelectric transducer $18d_2$ at time $t_1$ toward the position of the first photoelectric transducer $18d_1$ at time $t_1$. In this manner, the calculating unit 32 calculates the position of the edge 11d. According to a specific example, in the case of V=10 μm/s and T=0.4 s, the calculating unit 32 calculates coordinates, i.e., a position, that are spaced 4 μm from the position of the second photoelectric transducer $18d_2$ at time $t_1$ toward the position of the first photoelectric transducer $18d_1$ at time $t_1$.

According to the present embodiment, the position of the edge 11d is identified on the basis of information of a change in the detected amount of the reflected laser beam that is acquired by the beam detecting unit 18 by moving the laser displacement gage 12. Therefore, the position of the edge 11d can be detected even at a position between two photoelectric transducers 18d. If each of the predetermined intervals 18e is represented by D, then the calculating unit 32 may calculate the position of the edge 11d by calculating coordinates that are spaced (D−V·T) from the position of the first photoelectric transducer $18d_1$ at time $t_1$ toward the position of the second photoelectric transducer $18d_2$ at time $t_1$.

Figure 7A:
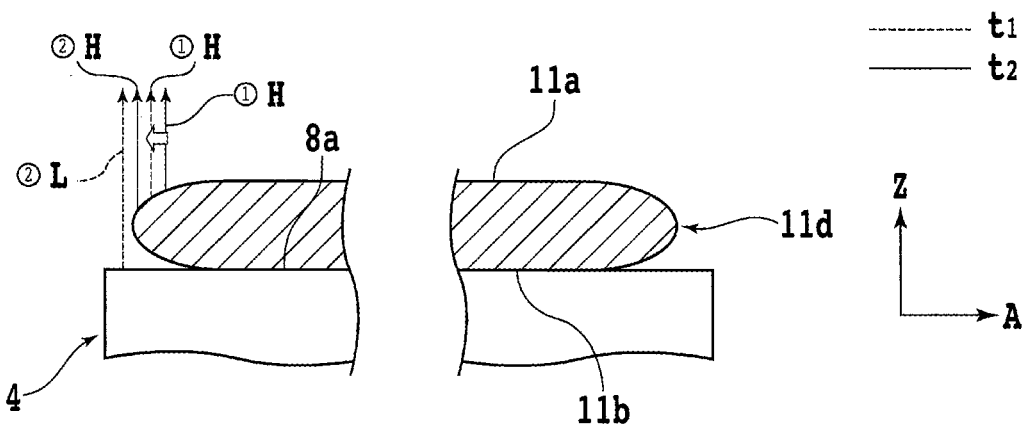
FIG. 7A is a view illustrating a first modification of the edge position detecting method.

Next, modifications of the first embodiment will be described below. FIG. 7A illustrates a first modification of the edge position detecting method. According to the first modification, the laser displacement gage 12 is moved in a direction opposite the direction in which the laser displacement gage 12 is moved according to the first embodiment. According to the first modification, both the output voltages from the first photoelectric transducer $18d_1$ and the second photoelectric transducer $18d_2$ at time $t_1$ are H. The output voltage from the first photoelectric transducer $18d_1$ at time $t_2$ remains H, and the output voltage from the second photoelectric transducer $18d_2$ at time $t_2$ changes from H to L.

According to the first modification, coordinates of the edge 11d are calculated in S10 through S40.

Figure 7B:
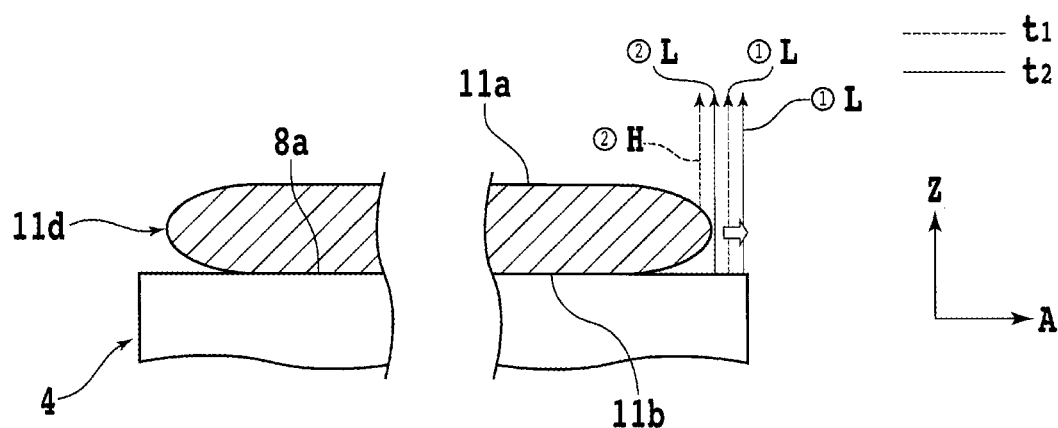
FIG. 7B is a view illustrating a second modification of the edge position detecting method.

FIG. 7B illustrates a second modification of the edge position detecting method. According to the second modification, coordinates of the edge 11d that are opposite the coordinates of the edge 11d calculated according to the first embodiment across the center 11e of the face side 11a are calculated. According to the second modification, the output voltage from the first photoelectric transducer $18d_1$ at time $t_1$ is L, and the output voltage from the second photoelectric transducer $18d_2$ at time $t_1$ is H. The output voltage from the first photoelectric transducer $18d_1$ at time $t_2$ remains L, and the output voltage from the second photoelectric transducer $18d_2$ at time $t_2$ changes from H to L.

Figure 7C:
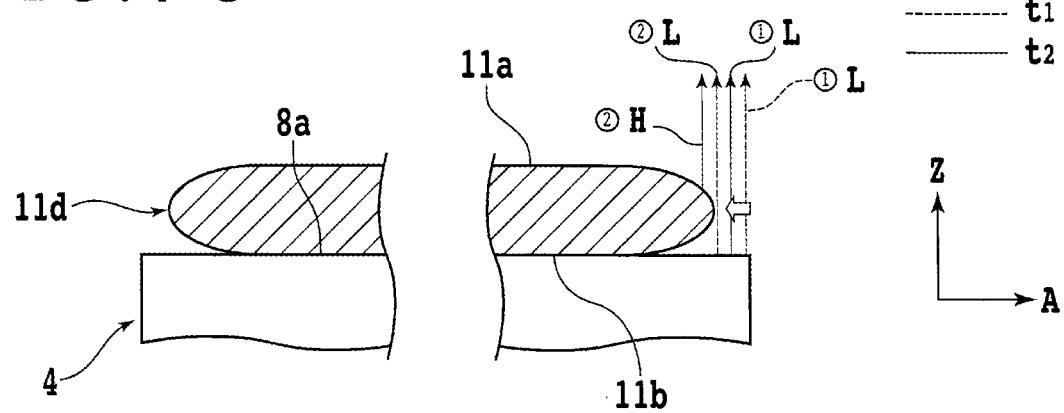
FIG. 7C is a view illustrating a third modification of the edge position detecting method.

FIG. 7C illustrates a third modification of the edge position detecting method. According to the third modification, the laser displacement gage 12 is moved in a direction opposite the direction in which the laser displacement gage 12 is moved according to the second modification. According to the third modification, both the output voltages from the first photoelectric transducer $18d_1$ and the second photoelectric transducer $18d_2$ at time $t_1$ are L. The output voltage from the first photoelectric transducer $18d_1$ at time $t_2$ remains L, and the output voltage from the second photoelectric transducer $18d_2$ at time $t_2$ changes from L to H. According to the second and third modifications, coordinates of the edge 11d are calculated in S10 through S40.

A second embodiment of the present invention will be described below. According to the second embodiment, though each of the predetermined intervals 18e is 10 μm, the relative movement speed V is 1000 μm/s and the sampling period is 1 ms. In this case, the laser displacement gage 12 is moved 1000 μm along the predetermined direction A in one second, and obtains 1000 pieces of data, i.e., H and L output voltages, from each of the photoelectric transducers 18d. Therefore, the laser displacement gage 12 is capable of obtaining 1000 pieces of data while moving 1000 μm by using one photoelectric transducer 18d.

In other words, the resolution of one photoelectric transducer 18d is 1 μm (=1000 μm/1000). According to the first embodiment, since the relative movement speed V is 10 μm/s and the sampling period is 0.1 s, the resolution of one photoelectric transducer 18d is 1 μm (=10 μm/10). According to the second embodiment, the relative movement speed V can be made higher by shortening the sampling period than that according to the first embodiment. In other words, the period of time required to move the laser displacement gage 12 can be made shorter than that according to the first embodiment.

A third embodiment of the present invention will be described below. According to the third embodiment, the laser displacement gage 12 is moved relatively to the chuck table 4 along the predetermined direction A, and the chuck table 4 is rotated about the rotational axis 10a at a predetermined rotation speed $V_R$, e.g., 10 rpm=60 degrees/second. The calculating unit 32 thus detects coordinates of a plurality of points on the edge 11d. Providing coordinates of three or more points on the edge 11d are detected, coordinates ($X_c$, $Y_c$) of the center 11e of the workpiece 11 can be identified (see FIG. 9). Further, since coordinates ($X_0$, $Y_0$) of the rotational axis 10a are known, shifts of the coordinates ($X_c$, $Y_c$) can be identified from the coordinates ($X_0$, $Y_0$) (see FIG. 9).

Figure 9:
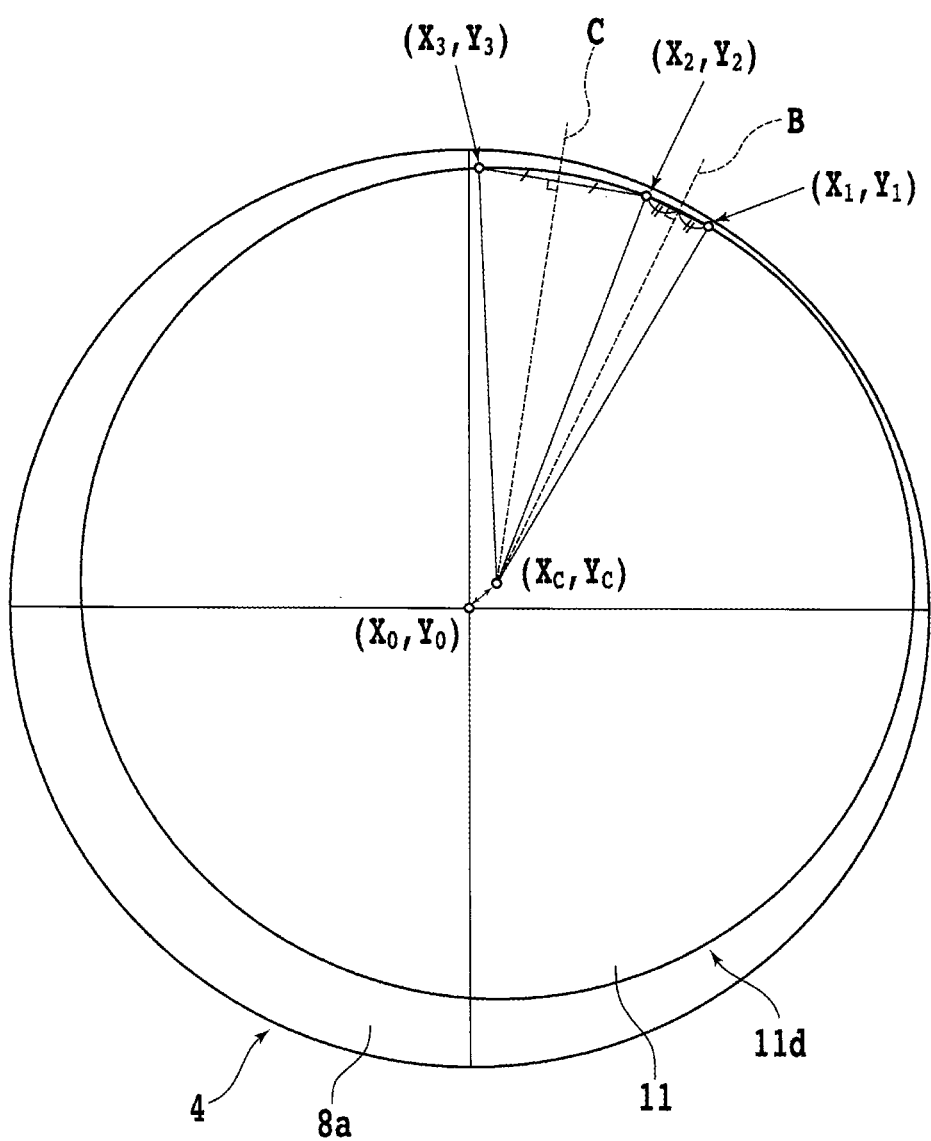
FIG. 9 is a diagram illustrative of a method of identifying coordinates of a center of a workpiece.
Figure 10:
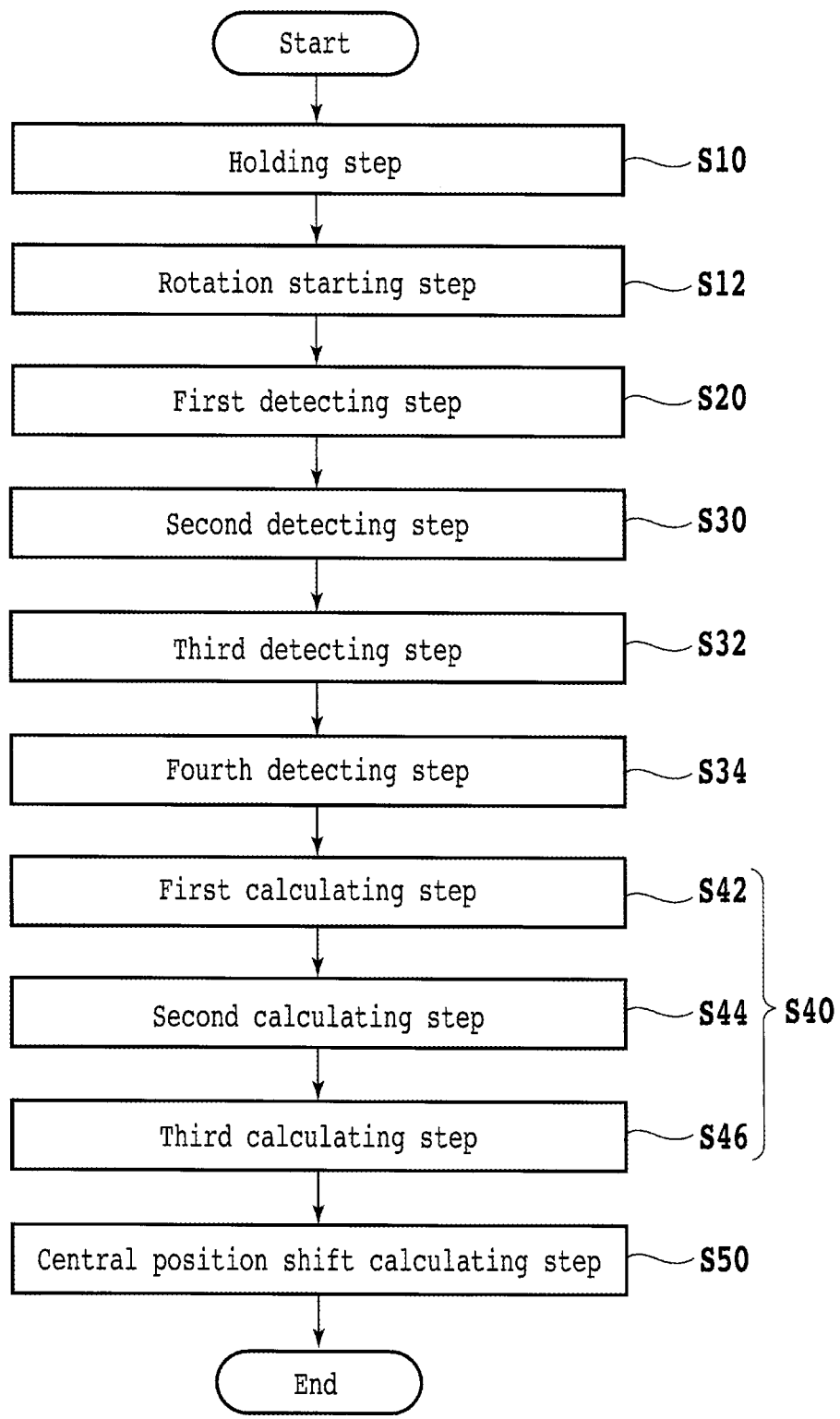
FIG. 10 is a flowchart of an edge position detecting method according to a third embodiment of the present invention.

An edge position detecting method according to the third embodiment will be described below with reference to FIGS. 8A through 10. FIG. 10 is a flowchart of the edge position detecting method according to the third embodiment. According to the third embodiment, after holding step S10, the chuck table 4 starts to rotate about the rotational axis 10a at the predetermined rotation speed $V_R$ (rotation starting step S12). Then, first detecting step S20 (time $t_1$) and second detecting step S30 (time $t_2$) are successively carried out. In this manner, information regarding coordinates of the edge 11d positioned between the first photoelectric transducer $18d_1$ and the second photoelectric transducer $18d_2$ is obtained at time $t_2$.

After second detecting step S30, other locations on the edge 11d are also detected using a third photoelectric transducer $18d_3$ and a fourth photoelectric transducer $18d_4$ that are disposed on a straight line at predetermined spaced intervals 18e along the longitudinal direction of the linear laser beam LA, in addition to the second photoelectric transducer $18d_2$. While the chuck table 4 is rotating at the rotation speed $V_R$, the laser displacement gage 12 is moved relatively to the chuck table 4 at the relative movement speed V. A change from L to H in the output voltage of the third photoelectric transducer $18d_3$ is detected (third detecting step S32). According to the present embodiment, detection timing in S32 after S30 (time $t_2$) is represented by time $t_3$.

Further, while the chuck table 4 is rotating at the rotation speed $V_R$, the laser displacement gage 12 is moved relatively to the chuck table 4 at the relative movement speed V. A change from L to H in the output voltage of the fourth photoelectric transducer $18d_4$ is detected (fourth detecting step S34). According to the present embodiment, detection timing in S34 after S32 (time $t_3$) is represented by time $t_4$. After fourth detecting step S34, the calculating unit 32 calculates first through third positions of the edge 11d (edge position calculating step S40). Edge position calculating step S40 includes first calculating step S42 for calculating the first position $(X_1, Y_1)$ of the edge 11d. In first calculating step S42, the calculating unit 32 calculates coordinates, i.e., a position, that are spaced $V \cdot T_1$ from the position of the second photoelectric transducer $18d_2$ in first detecting step S20 at time $t_1$ toward the position of the first photoelectric transducer $18d_1$ at time $t_1$. First period $T_1$ of time is represented by the difference between time $t_2$ and time $t_1$ ($T_1=t_2-t_1$).

Figure 8A:
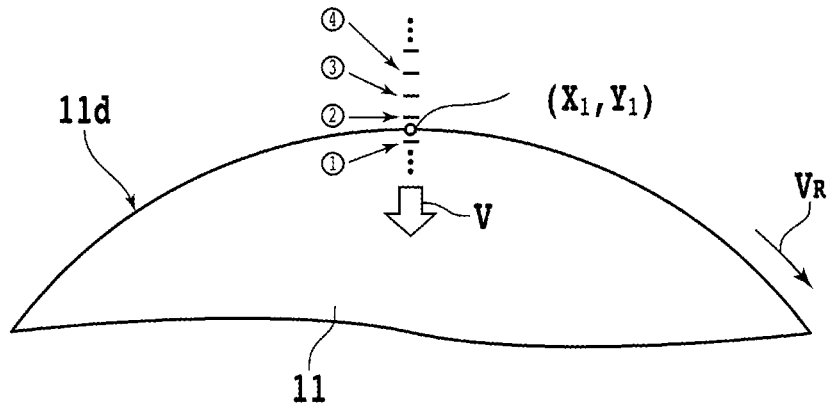
FIG. 8A is a view illustrating a first position of the edge positioned between the first and second photoelectric transducers.

FIG. 8A illustrates the first position of the edge 11d positioned between the first photoelectric transducer $18d_1$ and the second photoelectric transducer $18d_2$. First period $T_1$ of time is 0.4 s, for example. In this case, the first position $(X_1, Y_1)$ of the edge 11d when the chuck table 4 has rotated through $V_R \cdot T_1 = (60 \text{ degrees}/1 \text{ second}) \cdot 0.4 \text{ s} = 24$ degrees, i.e., the coordinates of the edge 11d at time $t_2$, is calculated. Edge position calculating step S40 further includes second calculating step S44 for calculating the second position $(X_2, Y_2)$ of the edge 11d. In second calculating step S44, the calculating unit 32 calculates coordinates, i.e., a position, that are spaced $V \cdot T_2$ from the position of the third photoelectric transducer $18d_3$ in second detecting step S30 at time $t_2$ toward the position of the second photoelectric transducer $18d_2$ at time $t_2$. Second period $T_2$ of time is represented by the difference between time $t_3$ and time $t_2$ ($T_2=t_3-t_2$).

Figure 8B:
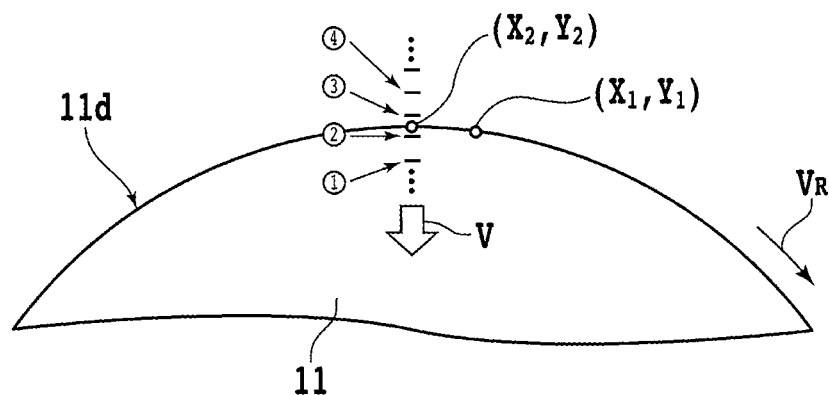
FIG. 8B is a view illustrating a second position of the edge positioned between the second and third photoelectric transducers.

FIG. 8B illustrates the second position of the edge 11d positioned between the second photoelectric transducer $18d_2$ and the third photoelectric transducer $18d_3$ indicated by an encircled numeral 3. Second period $T_2$ of time is 0.8 s, for example. In this case, the second position $(X_2, Y_2)$ of the edge 11d when the chuck table 4 has rotated from the initial position through $V_R \cdot (T_1+T_2) = (60 \text{ degrees}/1 \text{ second}) \cdot 1.2$ s=72 degrees, i.e., the coordinates of the edge 11d at time $t_3$, is calculated.

Edge position calculating step S40 further includes third calculating step S46 for calculating the third position $(X_3, Y_3)$ of the edge 11d. In third calculating step S46, the calculating unit 32 calculates coordinates, i.e., a position, that are spaced $V \cdot T_3$ from the position of the fourth photoelectric transducer $18d_4$ in third detecting step S32 at time $t_3$ toward the position of the third photoelectric transducer $18d_3$ at time $t_3$. Third period $T_3$ of time is represented by the difference between time $t_4$ and time $t_3$ ($T_3=t_4-t_3$).

Figure 8C:
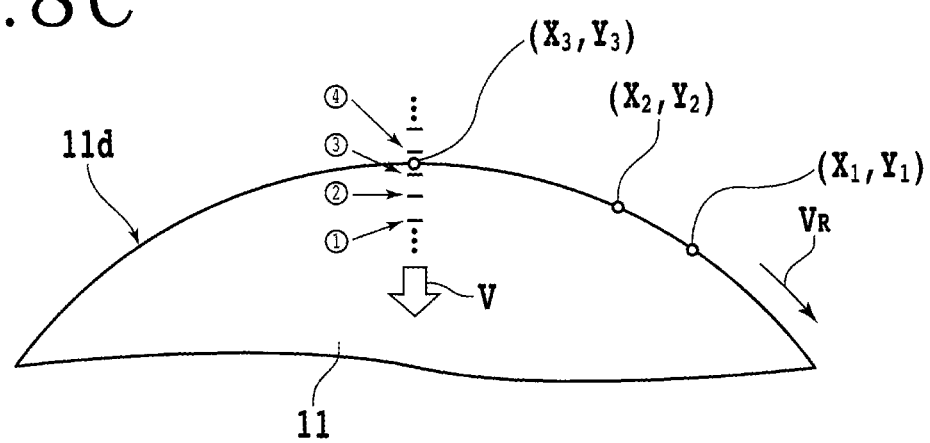
FIG. 8C is a view illustrating a third position of the edge positioned between the third and fourth photoelectric transducers.

FIG. 8C illustrates the third position of the edge 11d positioned between the third photoelectric transducer $18d_3$ and the fourth photoelectric transducer $18d_4$ indicated by an encircled numeral 4. Third period $T_3$ of time is 1.0 s, for example. In this case, the third position $(X_3, Y_3)$ of the edge 11d when the chuck table 4 has rotated from the initial position through $V_R \cdot (T_1+T_2+T_3) = (60 \text{ degrees}/1 \text{ second}) \cdot 2.2$ s=132 degrees, i.e., the coordinates of the edge 11d at time $t_4$, is calculated. In this fashion, as illustrated in FIG. 9, the coordinates of three different points on the edge 11d are obtained. The coordinates $(X_c, Y_c)$ of the center 11e of the workpiece 11 can be identified using the coordinates of three or more points on the edge 11d. FIG. 9 is illustrative of the method of identifying the coordinates $(X_c, Y_c)$ of the center 11e.

After edge position calculating step S40, central position shift calculating step S50 is carried out. In S50, the coordinates $(X_c, Y_c)$ of the center 11e are calculated by calculating a point of intersection between a perpendicular bisector B of a line segment interconnecting $(X_1, Y_1)$ and $(X_2, Y_2)$ and a perpendicular bisector C of a line segment interconnecting $(X_2, Y_2)$ and $(X_3, Y_3)$, for example. Since the coordinates $(X_0, Y_0)$ of the rotational axis 10a are known, shifts of the coordinates $(X_c, Y_c)$ of the center 11e from the coordinates $(X_0, Y_0)$ can be identified. The shifts are used to correct the position where a cutting blade, not illustrated, cuts into the workpiece 11 in a step of removing or trimming the outer circumferential portion 11c of the face side 11a of the workpiece 11 after the edge position has been detected, for example.

The structures, methods, etc., according to the above embodiments may be changed or modified, and such changes and modifications may be carried out without departing from the scope of the present invention. First calculating step S42, second calculating step S44, and third calculating step S46 may not necessarily be performed in the named sequence. In the edge position detecting method according to the third embodiment, the coordinates $(X_c, Y_c)$ of the center 11e may be calculated on the basis of different coordinates of four or more points.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An edge position detecting apparatus for detecting a position of an edge of a disk-shaped workpiece, comprising:
  a chuck table having a holding surface for holding the workpiece thereon;
  a laser displacement gage having a laser applying unit including a light source disposed above the chuck table, for applying a linear laser beam shaped into a linear shape extending in a first direction from the light source toward the holding surface to form an irradiated area; across the edge of the workpiece, and a beam detecting unit including a plurality of photoelectric transducers arrayed at predetermined spaced intervals in the first direction, for detecting a reflection of the linear laser beam, wherein the photoelectric transducers include a first photoelectric transducer and a second photoelectric transducer that are disposed adjacent to each other in the first direction; a moving mechanism for moving the laser displacement gage and the chuck table relatively to each other along the first direction while the workpiece is being rotated about a predetermined rotational axis of the chuck table; and a calculating unit having a processor, for calculating the position of the edge of the workpiece on a basis of information of a change in an amount of the reflection detected by the beam detecting unit;

wherein the calculating unit calculates the position of the edge of the workpiece in response to:
1) the detecting unit reading outputs of the first and second photoelectric transducers at a first time $t_1$,
2) the moving mechanism moving the laser displacement gage and the chuck table relatively to each other at a relative movement speed V along the first direction,
3) monitoring the outputs of the first and second photoelectric transducers and detecting a change in an amount of a reflection of the linear laser beam detected by the second photoelectric transducer while an amount of the reflection detected by the first photoelectric transducer remains unchanged, the time at which a change in an amount of a reflection of the linear laser beam is detected by the second photoelectric transducer being designated a second time $t_2$, whereby a period of time T is defined by $t_2-t_1$,
4) the calculating unit calculating an edge position that is spaced V·T from an original position of the second photoelectric transducer at time $t_1$, thereby calculating the position of the edge of the workpiece.

2. The edge position detecting apparatus according to claim 1,
wherein the chuck table is rotatable about the predetermined rotational axis, and
the first direction is perpendicular to the predetermined rotational axis, and
wherein the calculating unit calculates the position of the edge of the workpiece as a position that is spaced V·T from an original position of the second photoelectric transducer in response to the laser displacement gage being moved toward a position of the first photoelectric transducer adjacent to the second photoelectric transducer.

3. An edge position detecting method for detecting a position of an edge of a disk-shaped workpiece, comprising:
a holding step of holding a surface of the workpiece on a holding surface of a chuck table;
a first detecting step of applying a linear laser beam shaped into a linear shape perpendicular to a direction of travel to another surface of the workpiece that is positioned opposite the surface thereof, across the edge of the workpiece, and detecting a reflection of the linear laser beam with a first photoelectric transducer and a second photoelectric transducer adjacent thereto among a plurality of photoelectric transducers arrayed at predetermined spaced intervals along a longitudinal direction of an irradiated area that is irradiated by the linear laser beam;
a second detecting step of moving the linear laser beam and the chuck table relatively to each other along the longitudinal direction of the irradiated area while the linear laser beam is being applied to the other surface of the workpiece across the edge of the workpiece, to thereby detect a change in an amount of a reflection of the linear laser beam detected by the second photoelectric transducer; and an edge position calculating step of calculating the position of the edge of the workpiece by calculating a position that is spaced a distance $V \cdot T_1$ from a position of the second photoelectric transducer toward a position of the first photoelectric transducer in the first detecting step, on a basis of the distance $V \cdot T_1$ calculated as a product of first period $T_1$ of time from a detection timing in the first detecting step to a detection timing in the second detecting step and a relative movement speed V at which the linear laser beam and the chuck table are moved relatively to each other along the longitudinal direction of the irradiated area, wherein the second detecting step is performed while the chuck table is rotated at a predetermined rotational speed $V_R$ (degrees/second) about a predetermined rotational axis of the chuck table.

4. The edge position detecting method according to claim 3,
wherein the chuck table is rotatable about the predetermined rotational axis,
the longitudinal direction of the irradiated area is disposed along a predetermined direction perpendicular to the predetermined rotational axis,
the edge position calculating step includes
after the holding step, a rotation starting step of starting to rotate the chuck table at a predetermined rotational speed $V_R$ (degrees/second) about the predetermined rotational axis,
a third detecting step of detecting a change in an amount of the reflection detected by a third photoelectric transducer among the first photoelectric transducer, the second photoelectric transducer, the third photoelectric transducer, and a fourth photoelectric transducer that are disposed on a straight line at the predetermined spaced intervals, and
a fourth detecting step of detecting a change in an amount of the reflection detected by the fourth photoelectric transducer, and
the edge position calculating step further includes
a first calculating step of calculating a position that is spaced $V \cdot T_1$ from the position of the second photoelectric transducer toward the position of the first photoelectric transducer in the first detecting step, to thereby detect a first position of the edge of the workpiece when the chuck table has rotated $V_R \cdot T_1$,
a second calculating step of calculating a position that is spaced $V \cdot T_2$ from a position of the third photoelectric transducer toward the position of the second photoelectric transducer in the second detecting step, on a basis of second period $T_2$ of time from the detection timing in the second detecting step to a detection timing in the third detecting step, to thereby detect a second position of the edge of the workpiece when the chuck table has rotated $V_R \cdot (T1-T2)$, and
a third calculating step of calculating a position that is spaced $V \cdot T_3$ from a position of the fourth photoelectric transducer toward the position of the third photoelectric transducer in the third detecting step, on a basis of third period $T_3$ of time from the detection timing in the third detecting step to a detection timing in the fourth detecting step, to thereby detect a third position of the edge of the workpiece when the chuck table has rotated $V_R \cdot (T_1+T_2+T_3)$.

5. The edge position detecting apparatus according to claim 2, wherein the first direction extends in a radial direction extending from the rotational axis of the chuck table.

6. The edge position detecting apparatus according to claim 1,
   wherein the first and second photoelectric transducers are spaced apart from each other in the first direction by 10 μm,
   wherein V is 1000 μm/s,
   wherein the outputs of the first and second photoelectric transducers are sampled at a sampling period of 1 ms, and
   whereby the resolution of edge position detecting apparatus is 1 μm.

7. The edge position detecting apparatus according to claim 1,
   wherein the first and second photoelectric transducers are spaced apart from each other in the first direction by 10 μm,
   wherein V is 10 μm/s,
   wherein the outputs of the first and second photoelectric transducers are sampled at a sampling period of 0.1 ms, and
   whereby the resolution of edge position detecting apparatus is 1 μm.

8. The edge position detecting apparatus according to claim 1,
   wherein the first and second photoelectric transducers are spaced apart from each other in the first direction by 10 μm, and
   wherein the resolution of edge position detecting apparatus is 1 μm.

9. An edge position detecting method for detecting a position of an edge of a disk-shaped workpiece, comprising:
   a holding step of holding a first surface of the workpiece on a holding surface of a chuck table;
   a first detecting step of applying a linear laser beam shaped into a linear shape extending in a first direction to irradiate an area of a second surface of the workpiece, across the edge of the workpiece, and detecting a reflection of the linear laser beam with a first photoelectric transducer and a second photoelectric transducer adjacent thereto among a plurality of photoelectric transducers arrayed at predetermined spaced intervals in the first direction, sampling outputs of the first and second photoelectric transducers at a first time $t_1$;
   a second detecting step of moving the linear laser beam and the chuck table relatively to each other in the first direction while the linear laser beam is being applied to the second surface of the workpiece across the edge of the workpiece, to thereby detect a second time $t_2$ when there is a change in an amount of a reflection of the linear laser beam detected by the second photoelectric transducer while an amount of the reflection detected by the first photoelectric transducer remains unchanged, the difference in time $t_2-t_1$ defining a first time period $T_1$; and
   an edge position calculating step of calculating the position of the edge of the workpiece by calculating a position that is spaced a distance $V \cdot T_1$ from a position of the second photoelectric transducer toward a position of the first photoelectric transducer in the first detecting step, on a basis of the distance $V \cdot T_1$ calculated as a product of the first period $T_1$ of time from a detection timing in the first detecting step to a detection timing in the second detecting step and a relative movement speed V at which the linear laser beam and the chuck table are moved relatively to each other along the first direction of the irradiated area,
   wherein the second detecting step is performed while the chuck table is rotated at a predetermined rotational speed $V_R$ (degrees/second) about a predetermined rotational axis of the chuck table.

10. The edge position detecting method according to claim 9,
    wherein the first and second photoelectric transducers are spaced apart from each other in the first direction by 10 μm,
    wherein V is 1000 μm/s,
    wherein the outputs of the first and second photoelectric transducers are sampled at a sampling period of 1 ms, and
    whereby the resolution of edge position detecting method is 1 μm.

11. The edge position detecting method according to claim 9,
    wherein the first and second photoelectric transducers are spaced apart from each other in the first direction by 10 μm,
    wherein V is 10 μm/s,
    wherein the outputs of the first and second photoelectric transducers are sampled at a sampling period of 0.1 ms, and
    whereby the resolution of edge position detecting method is 1 μm.

12. The edge position detecting method according to claim 9,
    wherein the first and second photoelectric transducers are spaced apart from each other in the first direction by 10 μm, and
    wherein the resolution of edge position detecting method is 1 μm.

13. The edge position detecting method according to claim 9, wherein
    the chuck table is rotatable about the predetermined rotational axis located at a center position $(X_0, Y_0)$,
    the first direction is perpendicular to the predetermined rotational axis,
    the edge position calculating step includes:
    after the holding step, a rotation starting step of starting to rotate the chuck table at the predetermined rotational speed $V_R$ (degrees/second) a bout the predetermined rotational axis,
    wherein the first and second detecting steps are performed after the rotation starting step;
    a third detecting step performed after time $t_2$ of detecting a time $t_3$ when a change in an amount of the reflection is detected by a third photoelectric transducer among the first photoelectric transducer, the second photoelectric transducer, the third photoelectric transducer, and a fourth photoelectric transducer that are disposed on a straight line at the predetermined spaced intervals;
    a fourth detecting step of detecting a change in an amount of the reflection detected by the fourth photoelectric transducer, and
    the edge position calculating step further includes:
    a first calculating step of calculating a position that is spaced $V \cdot T_1$ from the position of the second photoelectric transducer toward the position of the first photoelectric transducer in the first detecting step, to thereby detect a first position $(X_1, Y_1)$ of the edge of the workpiece when the chuck table has rotated $V_R \cdot T_1$, a second calculating step of calculating a position that is spaced $V \cdot T_2$ from a position of the third photoelectric transducer toward the position of the second photoelectric transducer in the second detecting step, on a basis of second period $T_2$ of time from the detection timing in the second detecting step to a detection timing in the third detecting step, to thereby detect a second position $(X_2, Y_2)$ of the edge of the workpiece when the chuck table has rotated $V_R \cdot (T_1+T_2)$, and a third calculating step of calculating a position that is spaced $V \cdot T_3$ from a position of the fourth photoelectric transducer toward the position of the third photoelectric transducer in the third detecting step, on a basis of third period $T_3$ of time from the detection timing in the third detecting step to a detection timing in the fourth detecting step, to thereby detect a third position $(X_3, Y_3)$ of the edge of the workpiece when the chuck table has rotated $V_R \cdot (T_1+T_2+T_3)$.

14. The edge position detecting method according to claim 13, further comprising a central position shift calculating step wherein the disk-shaped workpiece has a center at position $(X_c, Y_c)$, whereby the location of the center of the workpiece $(X_c, Y_c)$ relative to the center $(X_0, Y_0)$ position of rotational axis of the chuck table is calculated by calculating a point of intersection between a perpendicular bisector B of a line segment interconnecting $(X_1, Y_1)$ and $(X_2, Y_2)$ and a perpendicular bisector C of a line segment interconnecting $(X_2, Y_2)$ and $(X_3, Y_3)$.

* * * * *

UNITED STATES PATENT AND TRADEMARK OFFICE
CERTIFICATE OF CORRECTION

PATENT NO. : 11,819,950 B2
APPLICATION NO. : 17/323282
DATED : November 21, 2023
INVENTOR(S) : Atsushi Komatsu It is certified that error appears in the above-identified patent and that said Letters Patent is hereby corrected as shown below:

In the Claims

Column 12, Line 64, delete "irradiated area; across" and insert --irradiated area across-- therefor.

Column 14, Lines 59-60, delete "$V_R \cdot (T_1 - T_2)$" and insert --$V_R \cdot (T_1 + T_2)$-- therefor.

Column 16, Line 49, delete "a bout" and insert --about-- therefor.

Signed and Sealed this
Third Day of September, 2024

Katherine Kelly Vidal
*Director of the United States Patent and Trademark Office*